United States Patent [19]

Monticelli

[11] Patent Number: 4,468,636

[45] Date of Patent: Aug. 28, 1984

[54] LOW TEMPERATURE COEFFICIENT WIDE BAND-WIDTH VOLTAGE CONTROLLED OSCILLATOR

[75] Inventor: Dennis M. Monticelli, Fremont, Calif.

[73] Assignee: National Semiconductor Corporation, Santa Clara, Calif.

[21] Appl. No.: 289,334

[22] Filed: Aug. 3, 1981

[51] Int. Cl.³ .......................................... H03K 3/282
[52] U.S. Cl. .............................. 331/113 R; 331/111; 307/291
[58] Field of Search ........................ 331/113 R, 111; 307/291

[56] References Cited

U.S. PATENT DOCUMENTS

| | | | |
|---|---|---|---|
| 3,435,257 | 3/1969 | Lawrie, Jr. | 307/291 |
| 3,644,844 | 2/1972 | Bankovic | 331/113 R |
| 3,855,551 | 12/1974 | Ishigaki et al. | 331/113 R |
| 3,857,110 | 12/1974 | Grebene | 331/113 R |

Primary Examiner—Stanley D. Miller
Assistant Examiner—B. P. Davis
Attorney, Agent, or Firm—Gail W. Woodward; Paul J. Winters; Michael J. Pollock

[57] ABSTRACT

An emitter coupled oscillator having a wide bandwidth capability is tuned by an applied voltage or current. The oscillator obtains its feedback coupling by means of a differential amplifier which greatly reduces the second order temperature versus frequency drift. This is accomplished by forcing the oscillator to trip under conditions which greatly reduce $V_{BE}$ in the switching transistors.

5 Claims, 4 Drawing Figures

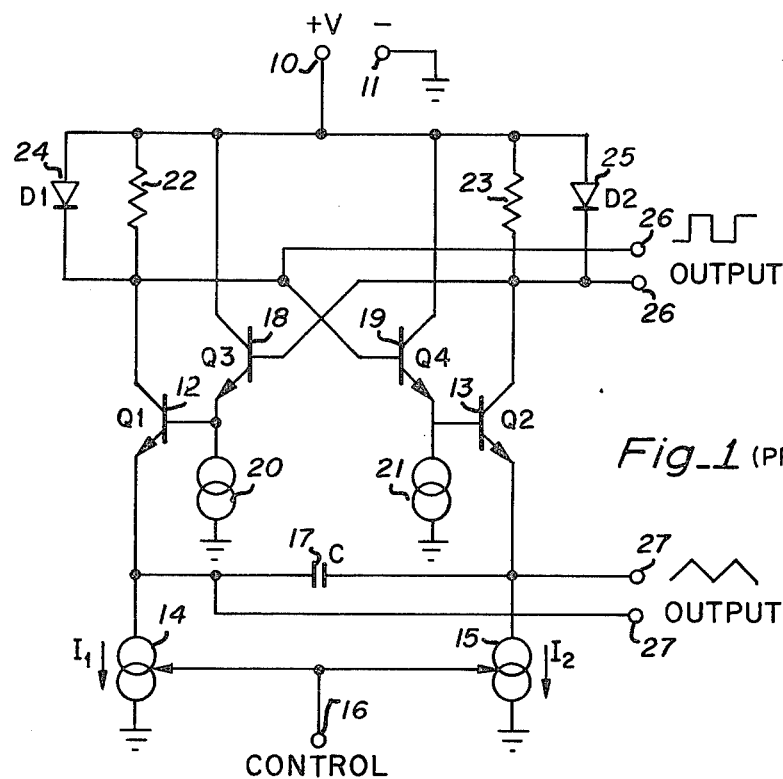
Fig_1 (PRIOR ART)
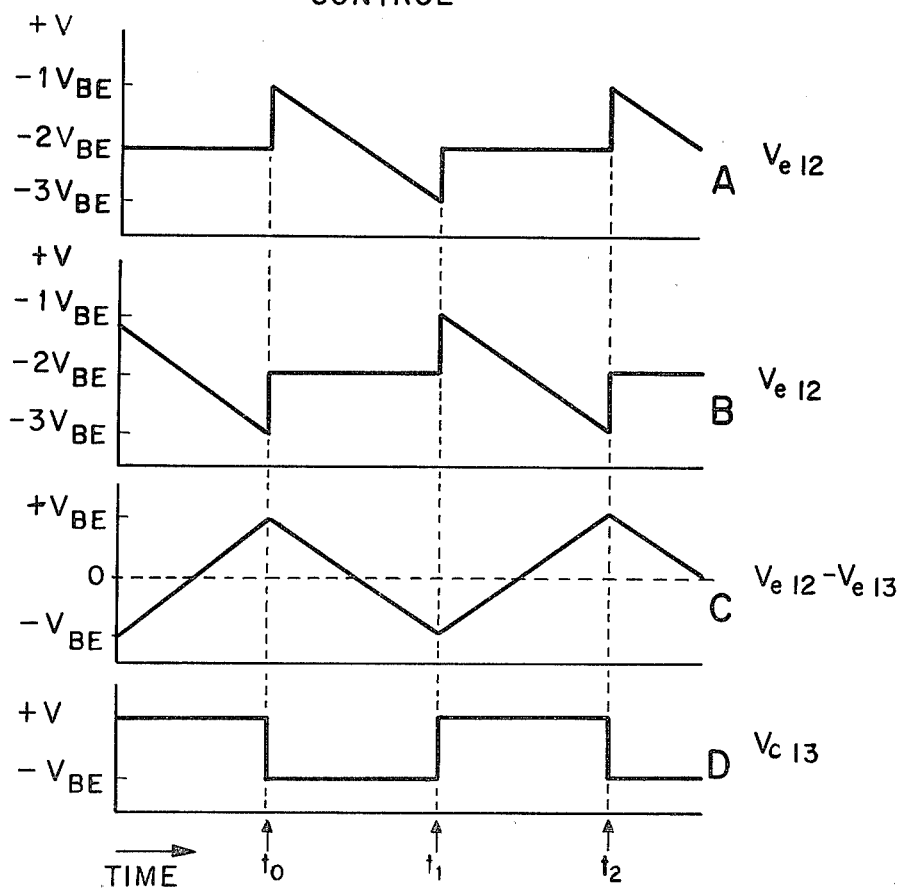
Fig_2 (PRIOR ART)

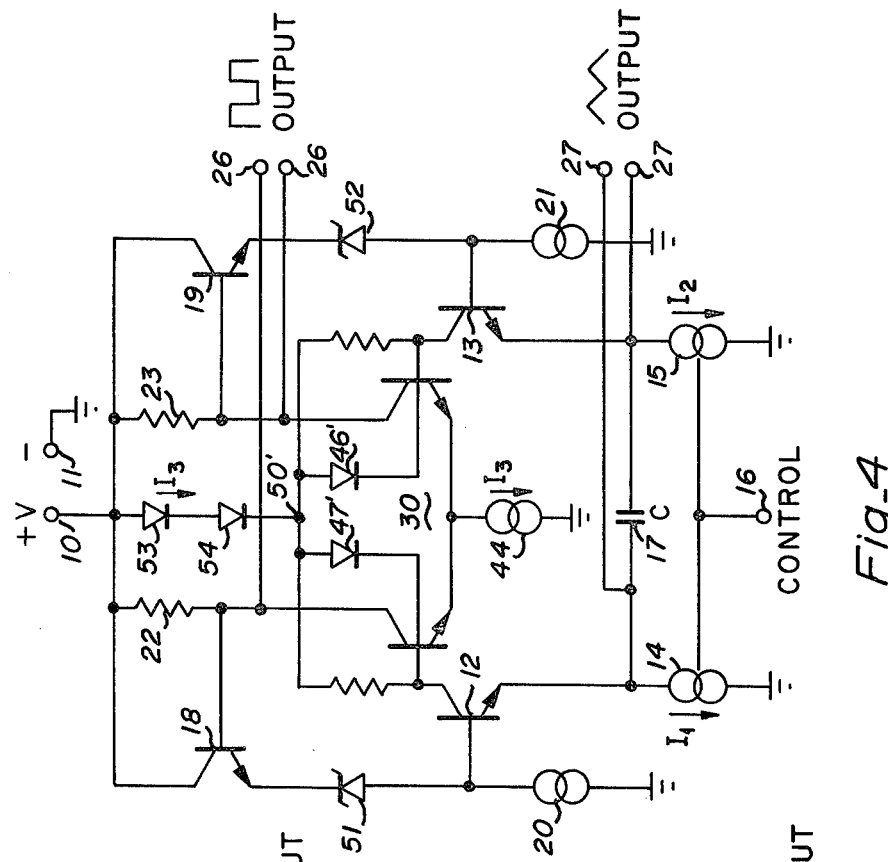
Fig_4
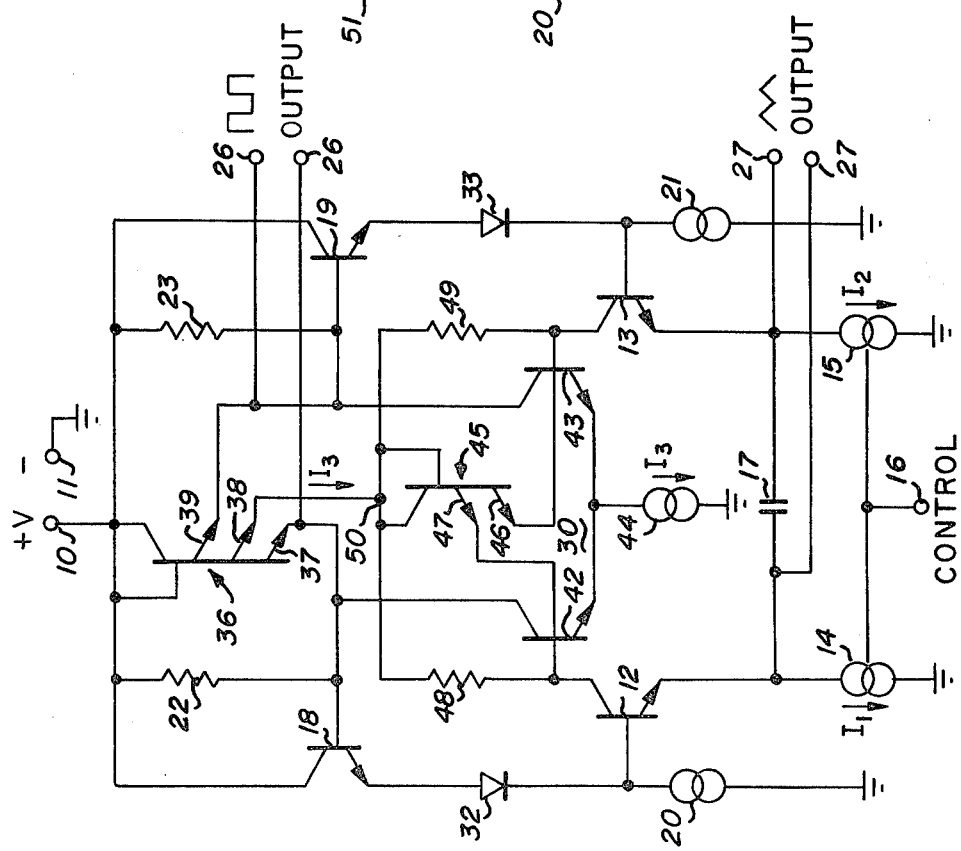
Fig_3

LOW TEMPERATURE COEFFICIENT WIDE BAND-WIDTH VOLTAGE CONTROLLED OSCILLATOR

BACKGROUND OF THE INVENTION

The invention relates to a voltage controlled oscillator (VCO) which produces an output frequency that varies in response to an applied voltage (or current). Such oscillators are useful in phase locked loop (PLL) applications which can employ digital techniques to obtain precise signal frequencies over a broad frequency spectrum. VCO circuits using monolithic silicon integrated circuit (IC) approaches have proven to be difficult. The best wideband circuits employ only NPN signal transistors in order to take fullest advantage of the transistor capability. The best circuits have rather large temperature versus frequency drifts and require temperature compensation. The basic drift is related to transistor $V_{BE}$ which changes at about 2 MV/C.° which represents a 0.33%/C.° drift. Typically when such a circuit is compensated the drift is reduced to about 0.06%. Beyond this point second order effects set in and simple compensation is of little avail.

SUMMARY OF INVENTION

It is an object of the invention to provide an IC VCO which reduces the second order temperature drift effects.

It is a further object of the invention to reduce second order temperature-frequency drift effects in an IC VCO which employs only NPN transistors in the signal paths.

These and other objects are achieved in a circuit configured as follows. The basic oscillator is conventional. A capacitor is coupled between the two emitters of a pair of switching transistors. Each emitter is returned to the power supply through a constant current source. As the transistors alternately conduct, the capacitor first charges in one direction and then the other, thereby developing a triangular waveform. Since the capacitor is coupled between the emitters of two transistors, they can be connected into a latching configuration by means of a pair of cross coupled emitter followers. The capacitor peak-to-peak charge in this configuration will be equal to double the transistor $V_{BE}$. The circuit of the invention employs a differential amplifier driven from the switching transistors and connected to drive the emitter followers. The amplifier thereby provides the required cross coupling by virtue of its differential nature. Since the differential amplifier has a much narrower linear range than does a single transistor, the oscillatory trip point is forced to a level that greatly reduces the second order temperature-frequency drift.

BRIEF DESCRIPTION OF THE DRAWING

FIG. 1 is a schematic diagram of the prior art VCO.

FIG. 2 is a plurality of graphs showing the waveforms associated with the circuit of FIG. 1.

FIG. 3 is a schematic diagram of the basic circuit of the invention.

FIG. 4 is a schematic diagram of an alternative circuit using the invention.

DESCRIPTION OF THE PRIOR ART

FIG. 1 shows the conventional prior art VCO. A power supply is coupled between positive rail terminal 10 and ground rail terminal 11.

Transistors 12 and 13 conduct alternately and have their emitters connected directly to current source 14 and 15 respectively. These sources are controlled by the potential at terminal 16. Normally, $I_1 = I_2$ and is a function of the voltage at terminal 16.

Capacitor 17 is connected between the emitters of transistors 12 and 13. Thus, when transistor 12 is on and transistor 13 off, $I_2$ will flow as a charge on capacitor 17 and the right-hand capacitor plate will be pulled below the left-hand plate. In the reverse state, when transistor 12 is off and transistor 13 on, the capacitor charging will be reversed and equal to $I_1$. The charge voltage will also be reversed.

Transistors 18 and 19 act as level shifting emitter follower drivers for transistors 12 and 13 respectively. The emitter follower input circuits are cross coupled to the collectors of transistors 12 and 13 so as to create a latching configuration. Sources 20 and 21 act as emitter follower loads for transistors 18 and 19. The emitter followers do not have a critical function for circuit operation and can, under some circumstances, be eliminated. However, their level shifting characteristic avoids saturation in transistors 12 and 13, thereby providing improved high frequency operation of the circuit.

Resistors 22 and 23 shunted respectively by diodes 24 and 25 act as load elements for transistors 12 and 13. In operation, transistors 12 and 13 conduct alternately with the on transistor acting through an emitter follower to hold the other transistor off. In a typical case, the value of resistor 22 (or resistor 23) will be selected to carry about half of the maximum transistor current. The shunt diode carries the other half. This means that the resistors are relatively low in value (on the order of hundreds of ohms) so that when the associated transistors turn off, the voltage drop across the load is negligibly small. The operating cycle is as follows. Refer to FIG. 2 for waveforms.

Assuming a nominal value for $I_1$ and $I_2$, for example one milliampere, when transistor 13 is off, transistor 12 will conduct two milliamperes. Thus, $I_2$ will flow as a change in charge on capacitor 17. Since $I_2$ is constant, the capacitor will charge linearly. With transistor 12 on, it can be seen that transistor 18 is at its maximum conduction and diode 24 is on. Thus, the base of transistor 19 will be $V_{BE}$ below $+V$. This reduces conduction in transistors 19 and turns transistor 13 off. This also turns diode 25 off and resistor 23 pulls the base of transistor 18 close to $+V$, thereby holding it at maximum conduction to hold transistor 12 on.

Since the current in the emitter is $I_1 + I_2$ or about 2 ma, if one assumes a transistor Beta of about 200 and a current of about 100 microamperes in source 20, a current of only about 500 nanoamperes must flow in resistor 23. As mentioned above, the resistor value is selected so that when such a current flows, the voltage drop is negligibly small and is well below the threshold of diode conduction.

As capacitor 17 charges, it can be seen in FIG. 2 that its left-hand terminal (waveform A) is clamped at slightly over 2 $V_{BE}$ below $+V$ and the right-hand terminal (waveform B) is falling (due to $I_2$). When the right-hand terminal approaches 3 $V_{BE}$ below $+V$, transistor 13 will turn on. Its collector will pull down to one $V_{BE}$ below $+V$ (waveform D) and reduce conduction in transistor 18. This acts to turn transistor 12 off. Thus, at $t_o$ of FIG. 2, the current in diode 24 is shut off so that resistor 22 can pull the base of transistor 19 close to +V, thereby latching transistor 13 on.

The charging action of capacitor 17 is now reversed and it will now charge at a rate set by $I_1$. Transistor 13 now conducts to the level of $I_1+I_2$ and clamps the right-hand terminal of capacitor 17 at slightly over 2 $V_{BE}$ below +V (waveform B). The left-hand terminal of capacitor 17 will fall at a rate set by its value and $I_1$. When the fall is sufficient to turn transistor 12 back on, the circuit will again flip back to the starting conditions.

The circuit output can be taken at terminals 26 where a square wave is available at an amplitude of one $V_{BE}$ peak to peak (waveform D). This signal is virtually ideal for driving a transistor multiplier.

If desired, a triangular wave output, as shown in waveform C, can be taken from terminals 27. This waveform more closely approximates a sine wave and has a peak-to-peak amplitude of $2_{BE}$.

The frequency of oscillation is inversely related to the value of capacitor 17 and directly proportional to the values of $I_1$ and $I_2$. Thus, from control terminal 16 a V/F transduction occurs to terminals 26 and 27. If current sources 14 and 15 are NPN transistors, their base current will determine the frequency of oscillation to create an I/F transduction.

The major problem associated with the circuit of FIG. 1 is its temperature sensitivity. Since $V_{BE}$ varies about 2 mv. per °C., or about one part in 300, the frequency will shift accordingly. While this is only about 0.33% per C.°, it can be significant. This effect is typically compensated by applying a $V_{BE}$ related bias (not shown) to sources 14 and 15 and results in a reduced temperature dependence.

The remaining cause of temperature drift of approximately 0.06%/°C., is found in the circuit trip point. As mentioned above, the circuit trips when a negative going waveform drops to a level approximately 3 $V_{BE}$ below +V. At the trip point, one side of the circuit is conducting at a level of $I_1+I_2$ while the other side is at the threshold of conduction. This gives rise to a differential in current density, which may be as high as 100:1l. This gives rise to a $\Delta V_{BE}$, which has a positive temperature coefficient. This action introduces a second order effect into the oscillator temperature coefficient.

DESCRIPTION OF THE INVENTION

FIG. 2 shows the oscillator circuit of the invention. Where the parts function in a manner similar to those of FIG. 1, the same designations are used. The waveforms of FIG. 2 apply. As before, current sources 14 and 15 are connected to transistors 12 and 13 respectively and capacitor 17 is connected between the emitters. Emitter followers 18 and 19 perform their driver function but, due to diodes 32 and 33, provide a two $V_{BE}$ level shift.

A differential amplifier (diff-amp) 30 has been added to provide the cross coupling between the two sides of the circuit. A triple emitter transistor 36 provides the shunt diodes for load resistors 22 and 23 by way of emitters 37 and 39 respectively. The third diode, emitter 38, supplies current to diff-amp 30.

Dual diode connected transistor 45 provides a pair of shunt diodes across load resistors 48 and 49 which are connected to the collectors of transistors 12 and 13, respectively, to avoid possible saturation of those devices under certain conditions. Current source 44 conducting $I_3$ supplies tail current for diff-amp 30, the outputs of which are directly coupled to emitter followers 18 and 19.

Circuit node 50, which carries $I_3$, will be $V_{BE}$ below +V at all times because the emitter 38 is continuously conducting.

The active signal input range of diff-amp 30 is small relative to a $V_{BE}$. Thus, diff-amp 30 has a tendency to switch at zero differential input but, due to the high gain at regeneration, actually switches about 100 mV early. This in turn means that when the conduction of transistors 12 and 13 switches, their currents are much closer to equal than in the prior art. This greatly reduces the $\Delta V_{BE}$ at switching, thereby substantially reducing the second order temperature drift. Using the circuit of FIG. 3, the circuit drift can be reduced to 0.01%/°C. or better, which is at least a factor of six better than the prior art.

As can be seen in FIG. 3, the improved circuit can be fabricated using only NPN transistors. In IC construction, this results in maximum oscillation frequencies on the order of 100 MHz, although good TC performance is achieved only for frequencies where transistor switching times are small compared to a complete cycle (<10 MHz).

Figure 4 shows the circuit of an alternative embodiment of the invention. The clamping diodes across the load resistors of op-amp 30 have been omitted and the emitter follower level shifting increased by the use of zener diodes 51 and 52. For example, using 6-volt zeners will produce a 6.6 volt level shift between input and output. Using this circuit, the voltage drops across resistors 22 and 23 can be adjusted by selecting their value and the value of $I_3$, so that the output at terminals 26 can be programmed. Node 50 is biased at 2 $V_{BE}$ below +V by the action of diodes 53 and 54. In this circuit form, the output amplitude at terminals 26 can substantially exceed $V_{BE}$. For example, if $I_3$ in source 44 is one milliampere and resistor 22 and 23 are each 1000 ohms, the output at terminals 26 will be 1 volt peak to peak. Likewise, the amplitude of the triangle wave at terminals 27 is a direct function of $I_3$. Otherwise, the circuit functions substantially as does the circuit of FIG. 3.

The invention has been described and an alternative embodiment shown. When a person skilled in the art reads the foregoing description, there will occur to him alternatives and equivalents that are within the spirit and intent of my invention. Accordingly, it is intended that the scope of the invention be limited only by the following claims.

I claim:

1. In an oscillator circuit comprising:
   a first pair of transistors each of which has a series current source in its emitter, a parallel diode-resistor load in series with its collector and a base;
   a pair of emitter followers each having an output coupled to one of said bases of said first pair of transistors and an input cross coupled the collector of the opposite transistor of said first pair of transistors; and
   a capacitor coupled between said emitters of said first pair of transistors whereby said circuit oscillates at a frequency determined by the values of said capacitor and current sources;
   the improvement comprising:
   a differential amplifier having a pair of inputs coupled respectively to the collector electrodes of said first pair of transistors and a pair of outputs coupled respectively to said inputs of said pair of emitter followers whereby the differential amplifier provides said cross coupling between said inputs of said emitter followers.

2. The improvement of claim 1 wherein said differential amplifier comprises:
a second pair of transistors having their emitters coupled together and to a constant tail current source and wherein their base electrodes provide said pair of inputs and their collector electrodes provide said pair of outputs.

3. The improvement of claim 2 wherein a paralled resistor diode combination is coupled in series with each collector of said second pair of transistors to provide the load elements of said differential amplifier.

4. The improvement of claim 3 wherein said diodes of load elements are omitted and said tail current source is programmed to adjust the output amplitude of said differential amplifier.

5. The improvement of claim 4 wherein said emitter followers include zener diode level shifting means.

* * * * *